(12) United States Patent
Takasaki et al.

(10) Patent No.: US 10,529,495 B2
(45) Date of Patent: Jan. 7, 2020

(54) THIN-FILM CAPACITOR

(71) Applicant: TDK CORPORATION, Tokyo (JP)

(72) Inventors: Hiroshi Takasaki, Tokyo (JP);
Masahiro Hiraoka, Tokyo (JP);
Hitoshi Saita, Tokyo (JP); Kenichi Yoshida, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 15/725,571

(22) Filed: Oct. 5, 2017

(65) Prior Publication Data

US 2018/0102220 A1    Apr. 12, 2018

(30) Foreign Application Priority Data

Oct. 11, 2016 (JP) .................................. 2016-200164

(51) Int. Cl.
| | | |
|---|---|---|
| *H01G 4/33* | (2006.01) | |
| *H01G 4/232* | (2006.01) | |
| *H01G 4/005* | (2006.01) | |
| *H01G 4/40* | (2006.01) | |
| *H01G 7/06* | (2006.01) | |
| *H01L 49/02* | (2006.01) | |
| *H01G 4/30* | (2006.01) | |

(Continued)

(52) U.S. Cl.
CPC ............. *H01G 4/33* (2013.01); *H01G 4/005* (2013.01); *H01G 4/012* (2013.01); *H01G 4/232* (2013.01); *H01G 4/306* (2013.01); *H01G 4/40* (2013.01); *H01G 7/06* (2013.01); *H01L 28/91* (2013.01); *H01G 4/1209* (2013.01); *H01G 4/1218* (2013.01); *H01G 4/1254* (2013.01)

(58) Field of Classification Search
CPC .................................. H01G 4/30; H01G 4/306
USPC ............................... 361/301.4; 257/303, 309
See application file for complete search history.

(56) References Cited

U.S. PATENT DOCUMENTS

| | | | |
|---|---|---|---|
| 4,842,893 A | 6/1989 | Yializis et al. | |
| 5,018,048 A | 5/1991 | Shaw et al. | |
| 5,032,461 A | 7/1991 | Shaw et al. | |

(Continued)

FOREIGN PATENT DOCUMENTS

| | | | |
|---|---|---|---|
| JP | S55-091112 A | 7/1980 | |
| JP | S63-072108 A | 4/1988 | |

(Continued)

OTHER PUBLICATIONS

U.S. Appl. No. 15/725,654, filed Oct. 5, 2017 in the name of Yoshida et al.

(Continued)

*Primary Examiner* — Eric W Thomas
(74) *Attorney, Agent, or Firm* — Oliff PLC

(57) ABSTRACT

A thin-film capacitor includes a capacitor section in which electrode layers and dielectric layers are alternately stacked and which includes a hole portion that extends to the electrode layer. In a cross-section which is perpendicular to a stacking surface of the capacitor section and which passes through the hole portion, a side surface of the hole portion extends along a reference line extending in a direction intersecting the stacking surface, the dielectric layer extends up to the reference line toward the hole portion, and a gap is formed between the side surface of the pair electrode layer and the reference line.

5 Claims, 4 Drawing Sheets

(51) Int. Cl.
*H01G 4/012* (2006.01)
*H01G 4/12* (2006.01)

(56) References Cited

U.S. PATENT DOCUMENTS

| | | |
|---|---|---|
| 5,097,800 A | 3/1992 | Shaw et al. |
| 5,125,138 A | 6/1992 | Shaw et al. |
| 5,745,335 A | 4/1998 | Wall |
| 6,034,864 A | 3/2000 | Naito et al. |
| 6,134,098 A | 10/2000 | Kuroda et al. |
| 6,370,011 B1 | 4/2002 | Naito et al. |
| 6,411,494 B1 | 6/2002 | Wall |
| 6,462,932 B1 | 10/2002 | Naito et al. |
| 6,549,395 B1 | 4/2003 | Naito et al. |
| 6,724,611 B1 | 4/2004 | Mosley |
| 8,343,361 B2 | 1/2013 | Takeshima et al. |
| 2002/0109958 A1 | 8/2002 | Naito et al. |
| 2004/0099999 A1 | 5/2004 | Borland |
| 2004/0108134 A1 | 6/2004 | Borland et al. |
| 2004/0125539 A1 | 7/2004 | Murakami et al. |
| 2004/0201367 A1 | 10/2004 | Echigo et al. |
| 2004/0231885 A1 | 11/2004 | Borland et al. |
| 2004/0233611 A1 | 11/2004 | Borland |
| 2005/0063135 A1 | 3/2005 | Borland et al. |
| 2005/0121772 A1 | 6/2005 | Hayashi et al. |
| 2005/0195554 A1 | 9/2005 | Borland et al. |
| 2005/0269287 A1 | 12/2005 | Tsujimura et al. |
| 2005/0287755 A1 | 12/2005 | Bachmann et al. |
| 2006/0196599 A1 | 9/2006 | Satou |
| 2008/0145996 A1 | 6/2008 | Nomura et al. |
| 2009/0017591 A1 | 1/2009 | Cervin-Lawry et al. |
| 2009/0283819 A1* | 11/2009 | Ishikawa ........... H01L 21/28282 257/324 |
| 2010/0044831 A1 | 2/2010 | Guegan |
| 2010/0252527 A1* | 10/2010 | Takeshima ............. H01G 4/228 216/13 |
| 2012/0262836 A1 | 10/2012 | Chai |
| 2013/0048596 A1 | 2/2013 | Komuro et al. |
| 2013/0258796 A1 | 10/2013 | Hioka et al. |
| 2015/0093497 A1 | 4/2015 | Koutsaroff et al. |
| 2015/0334822 A1 | 11/2015 | Shinkawa et al. |
| 2015/0357401 A1 | 12/2015 | Pelloquin et al. |
| 2017/0345576 A1* | 11/2017 | Tsuyoshi ................. H01G 4/33 |

FOREIGN PATENT DOCUMENTS

| | | |
|---|---|---|
| JP | S63-310156 A | 12/1988 |
| JP | H1-120858 A | 5/1989 |
| JP | H1-278061 A | 11/1989 |
| JP | H03-034580 A | 2/1991 |
| JP | H4-111462 A | 4/1992 |
| JP | H8-078283 A | 3/1996 |
| JP | 2000-514243 A | 10/2000 |
| JP | 2006-510233 A | 3/2006 |
| JP | 2014090077 A | 5/2014 |
| WO | 98/000871 A1 | 1/1998 |
| WO | 2009/078225 A1 | 6/2009 |

OTHER PUBLICATIONS

U.S. Appl. No. 15/725,860, filed Oct. 5, 2017 in the name of Kumagae et al.

* cited by examiner

THIN-FILM CAPACITOR

TECHNICAL FIELD

The present invention relates to a thin-film capacitor.

BACKGROUND

A thin-film capacitor includes a capacitor section in which electrode layers and dielectric layers are alternately stacked multiple times. Hole portions extending from a top surface to the internal electrode layers are formed in the capacitor, and drawing electrodes that apply a voltage to the electrode layers are formed in the hole portions. An example of such a thin-film capacitor is described, for example, in PCT International Publication No. 2009/078225.

SUMMARY

In order to achieve an increase in capacitance of the thin-film capacitor, it is necessary to decrease a thickness of a dielectric layer interposed between a pair of electrodes in the capacitor section. However, when the dielectric layer is decreased in thickness, a distance between the electrode layers on and under the dielectric layer decreases. Then, for a reason for attachment of a conductive material to a side surface of the dielectric layer adjacent to the hole portion or the like, a likelihood that the upper and lower electrode layers will short-circuit increases. Accordingly, in the thin-film capacitor according to the related art, it is difficult to achieve an increase in capacitance while preventing characteristic defects.

The invention is made in consideration of the above-mentioned problem and an object thereof is to provide a thin-film capacitor that can prevent electrode layers from short-circuiting.

In order to achieve the above-mentioned object, a thin-film capacitor according to an embodiment of the invention includes a capacitor section in which electrode layers and dielectric layers are alternately stacked such that at least one dielectric layer is interposed in a stacking direction between a pair of electrode layers, the capacitor section including a hole portion that extends from an uppermost surface of the capacitor section to a lower electrode layer in the stacking direction of the pair of electrode layers, wherein, in a cross-section which is perpendicular to a stacking surface of the capacitor section and which passes through the hole portion, a side surface of the hole portion extends along a reference line extending in a direction intersecting the stacking surface, the at least one dielectric layer extends up to the reference line toward the hole portion, and a gap is formed between the side surface on the hole portion side of at least one of the pair of electrode layers and the reference line.

According to the thin-film capacitor according to the embodiment of the invention, since the gap is formed between the side surface on the hole portion side of the at least one of the pair of electrode layers and the reference line, a distance to be conducted when the pair of electrode layers short-circuit increases in comparison with a case in which such a gap is not formed. Accordingly, it is possible to prevent the pair of electrode layers from short-circuiting.

In the thin-film capacitor according to the embodiment of the invention, an area of the gap in the cross-section may be equal to or greater than 0.0025 $\mu m^2$ and equal to or less than 2.5 $\mu^2$. Since the area is equal to or greater than 0.0025 $\mu m^2$, the distance to be conducted when the pair of electrode layers short-circuits is satisfactorily large. Accordingly, it is possible to further prevent the pair of electrode layers from short-circuiting. Since the area is equal to or less than 2.5 $\mu m^2$, it is possible to prevent an end portion of the dielectric layer from being deformed due to insufficient support of the end portion of the dielectric layer in the gap.

In the thin-film capacitor according to the embodiment of the invention, the side surface on the hole portion side of the least one of the pair of electrode layers may have a convex shape or a concave shape with respect to the gap. Accordingly, it is possible to increase a surface area of an end face of the electrode layer and to prevent concentration of an electric field on an insulating material of the dielectric layer or the like.

The thin-film capacitor according to the embodiment of the invention may further include a protective layer that is formed of an insulating material and that is disposed in the hole portion along the reference line in the cross-section, and the protective layer may not be present in the gap. Since the side surfaces of the dielectric layer and the electrode layer adjacent to the hole portion are protected by the protective layer, it is possible to further prevent the electrode layers from short-circuiting. Since the protective layer is not present in the gap, it is possible to separate a current generation part which is easily formed in a dielectric material due to electrostriction from an end of the dielectric layer which is structurally vulnerable and therefore to further decrease a probability that the electrode layers will short-circuit.

The thin-film capacitor according to the embodiment of the invention may further include a protective layer that is formed of an insulating material and that is disposed in the hole portion along the reference line in the cross-section and the protective layer may be present also in the gap. Since the side surfaces of the dielectric layer and the electrode layer adjacent to the hole portion are protected by the protective layer, it is possible to further prevent the electrode layers from short-circuiting. Since the protective layer is present in the gap, it is possible to prevent an end portion of the electrode layer from being deformed due to insufficient support of the end portion of the electrode layer in the gap.

According to the invention, it is possible to provide a thin-film capacitor that can prevent electrode layers from short-circuiting.

DETAILED DESCRIPTION

Figure 1:
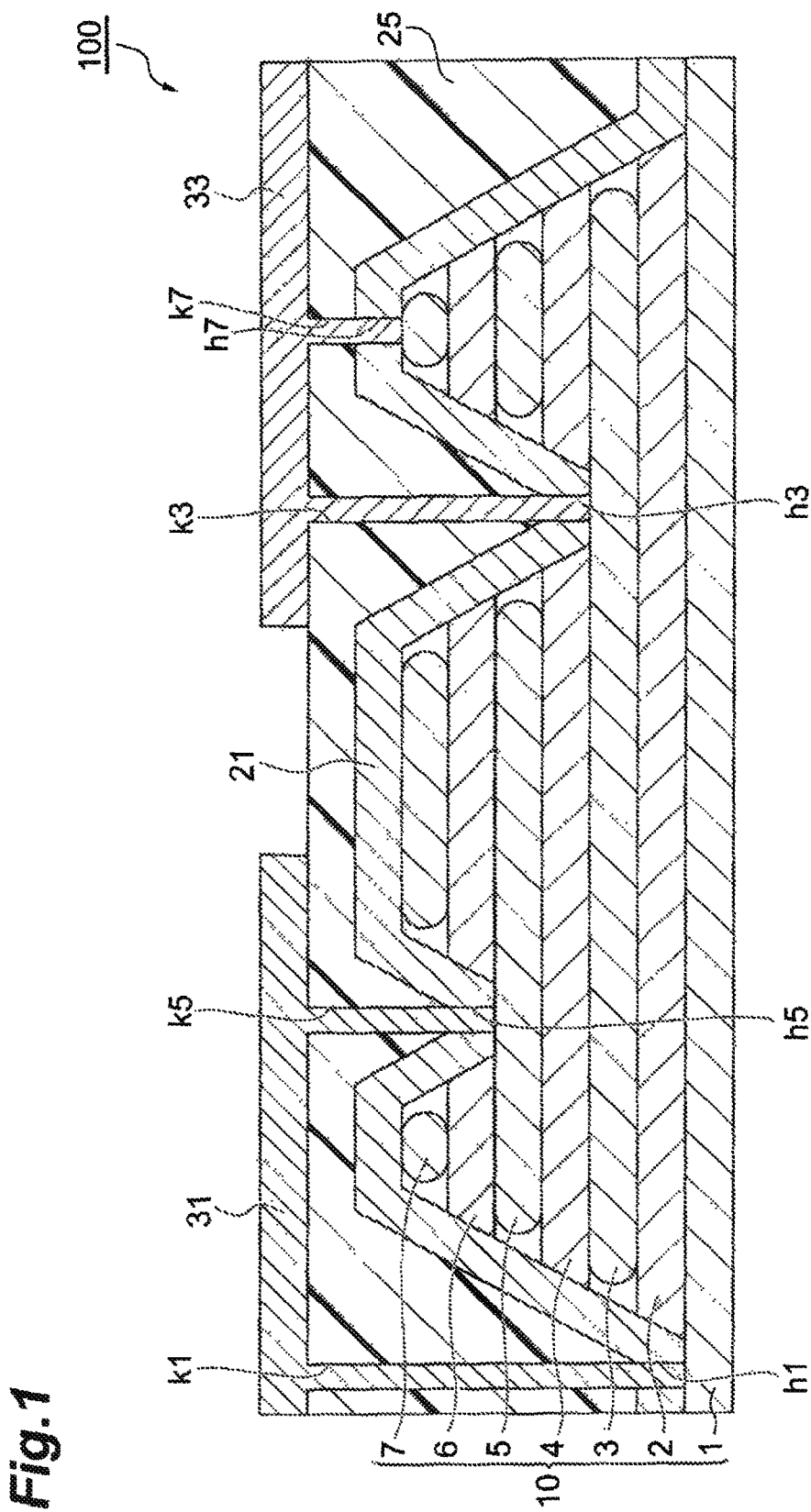
FIG. 1 is a cross-sectional view of a thin-film capacitor according to a first embodiment.

Hereinafter, embodiments of the invention will be described in detail with reference to the accompanying drawings. In the drawings, the same elements will be referenced by the same reference signs as much as possible. Dimension ratios in elements and between elements in the drawings are arbitrarily set for the purpose of easy understanding of the drawings.

First Embodiment

A thin-film capacitor according to a first embodiment of the invention will be described below. FIG. 1 is a cross-sectional view of a thin-film capacitor according to the first embodiment. As illustrated in FIG. 1, a thin-film capacitor 100 according to this embodiment includes a capacitor section 10, a protective layer 21, an insulating layer 25, and drawing electrodes 31 and 33.

The capacitor section 10 is formed by alternately stacking electrode layers and dielectric layers. That is, a lower electrode layer 1, a dielectric layer 2, an internal electrode layer 3, a dielectric layer 4, an internal electrode layer 5, a dielectric layer 6, and an upper electrode layer 7 are stacked in this order to constitute the capacitor section 10. The dielectric layer 2 is interposed in the stacking direction between the lower electrode layer 1 and the internal electrode layer 3 to constitute a capacitor. Similarly, the dielectric layer 4 is interposed in the stacking direction between the internal electrode layers 3 and 5 to constitute a capacitor, and the dielectric layer 6 is interposed in the stacking direction between the internal electrode layer 5 and the upper electrode layer 7 to constitute a capacitor.

FIG. 1 illustrates a cross-section of the thin-film capacitor 100 satisfying conditions that the cross-section is perpendicular to a stacking surface of the capacitor section 10 (a plane perpendicular to a stacking direction of the capacitor section 10) and passes through hole portions 11, 12, 13, and 14 (see FIG. 2) which will be described later.

The lower electrode layer 1, the internal electrode layer 3, the internal electrode layer 5, and the upper electrode layer 7 are formed of a conductive material and are formed of, for example, a metal material such as Ni, Pt, Pd, Cu, Cr, Ti, W, Al, or alloy of two or more thereof. Thicknesses of the lower electrode layer 1, the internal electrode layer 3, the internal electrode layer 5, and the upper electrode layer 7 in the stacking direction of the capacitor section 10 can be set to be, for example, equal to or greater than 50 nm and equal to or less than 1000 nm.

The dielectric layers 2, 4, and 6 are formed of a (ferroelectric) dielectric material having a perovskite structure such as $BaTiO_3$ (barium titanate), $(Ba_{1-x}Sr_x)TiO_3$ (barium strontium titanate), $(Ba_{1-x}Ca_x)TiO_3$, $PbTiO_3$, or $Pb(Zr_xTi_{1-x})O_3$, a complex perovskite relaxer type ferroelectric material such as $Pb(Mg_{1/3}Nb_{2/3})O_3$, a bismuth-layered compound such as $Bi_4Ti_3O_{12}$ or $SrBi_2Ta_2O_9$, a tungsten-bronze type ferroelectric material such as $(Sr_{1-x}Ba_x)Nb_2O_6$ or $PbNb_2O_6$, or the like. Here, in the perovskite structure, the complex perovskite relaxer type ferroelectric material, the bismuth-layered compound, and the tungsten-bronze type ferroelectric material, a ratio of A site and B site is normally an integer ratio, but may be intentionally deviated from the integer ratio for the purpose of improvement in characteristics. In order to control characteristics of the dielectric layers 2, 4, and 6, additives may be appropriately added as a secondary component to the dielectric layers 2, 4, and 6. Thicknesses of the dielectric layers 2, 4, and 6 in the stacking direction of the capacitor section 10 can be set to be, for example, equal to or greater than 50 nm and equal to or less than 1000 nm.

Figure 2:
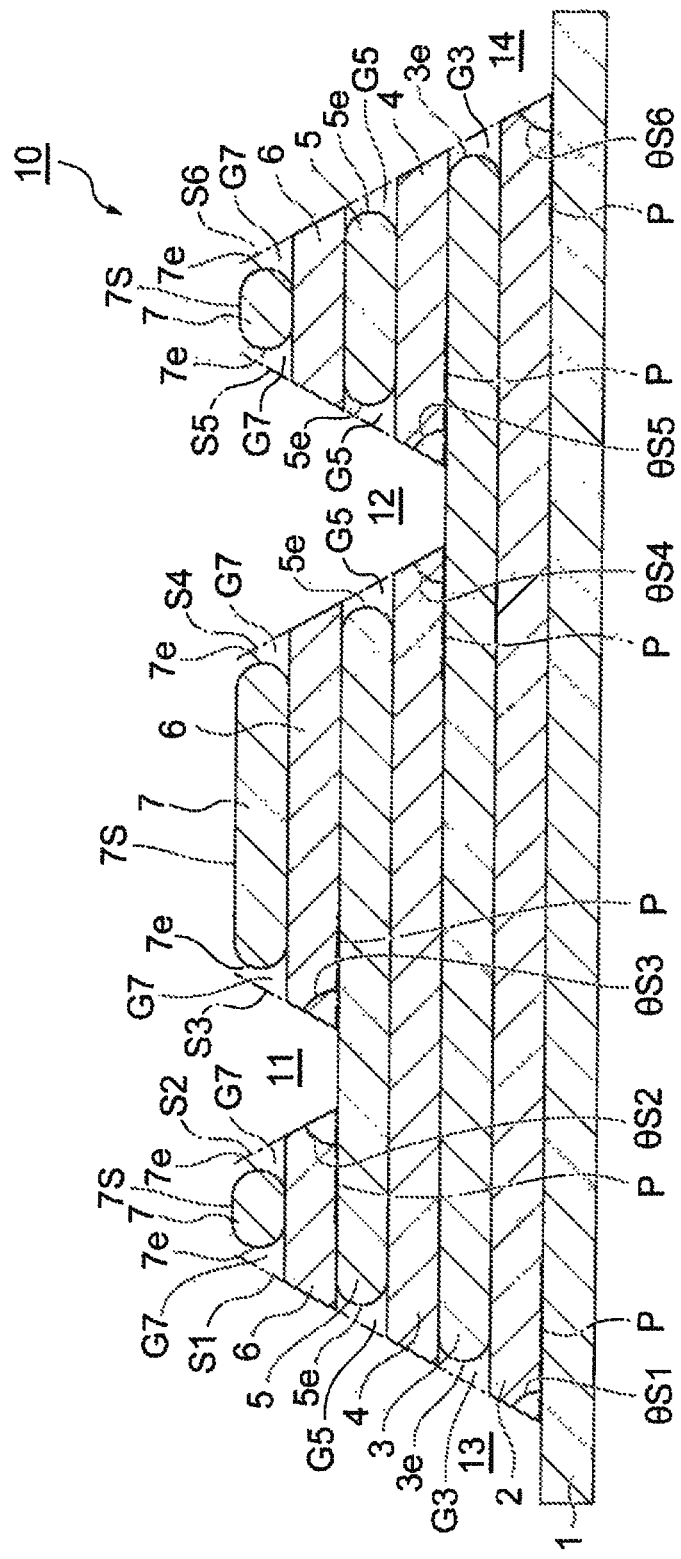
FIG. 2 is a cross-sectional view of a capacitor section.

The detailed configuration of the capacitor section 10 will be described below with reference to FIG. 2. FIG. 2 is a cross-sectional view of the capacitor section and is a diagram illustrating only the capacitor section 10 in the thin-film capacitor 100 illustrated in FIG. 1. As illustrated in FIG. 2, the capacitor section 10 includes hole portions 11, 12, 13, and 14.

The hole portion 11 extends from an uppermost surface of the capacitor section 10 (a surface 7S of the upper electrode layer 7 in this embodiment) to the internal electrode layer 5 in the stacking direction of the capacitor section 10. The hole portion 12 extends from the surface 7S of the upper electrode layer 7 to the internal electrode layer 3 in the stacking direction of the capacitor section 10. The hole portions 13 and 14 extend from the surface 7S of the upper electrode layer 7 to the lower electrode layer 1 in the stacking direction of the capacitor section 10.

The hole portions 11, 12, 13, and 14 have, for example, an inverted truncated cone shape or a cylindrical shape of which a center axis is parallel to the stacking direction of the capacitor section 10. When the hole portions 11, 12, 13, and 14 have such a shape, FIGS. 1 and 2 illustrate, for example, a cross-section of the capacitor section 10 passing through substantially the center axis of the hole portions 11, 12, 13, and 14.

As illustrated in FIG. 2, a side surface of the hole portion 13 in the cross-section extends along a reference line S1 extending in a direction intersecting the stacking surface P of the capacitor section 10. Similarly, two side surfaces of the hole portion 11 extend along reference lines S2 and S3 extending in a direction intersecting the stacking surface P, and two side surfaces of the hole portion 12 extend along reference lines S4 and S5 extending in a direction intersecting the stacking surface P, and side surfaces of the hole portion 14 extends along a reference line S6 extending in a direction intersecting the stacking surface P.

In the cross-section, the reference lines S1, S2, S3, S4, S5, and S6 have a substantially straight line shape. Angles θS1, θS2, θS3, θS4, θS5, and θS6 formed by the reference lines S1, S2, S3, S4, S5, and S6 and the stacking surface P are 90 degrees or acute angles and can be set to be, for example, equal to or greater than 15 degrees and equal to or less than 90 degrees. All the angles θS1, θS2, θS3, θS4, θS5, and θS6 may be the same angle or some or all thereof may be different angles.

It is preferable that the angles θS1, θS2, θS3, θS4, θS5, and θS6 be substantially 90 degrees. This is because an opposite area of each layer of the capacitor section 10 can be kept large and capacitance of the capacitor section 10 becomes large.

As illustrated in FIG. 2, paying attention to the hole portion 11, the dielectric layer 6 extends to the reference line S2 and the reference line S3 in the direction of the stacking surface P toward the hole portion 11. That is, in the cross-section illustrated in FIG. 2, the side surfaces of the dielectric layer 6 facing the hole portion 11 extend substantially along the reference line S2 and the reference line S3. Paying attention to the hole portion 12, the dielectric layers 4 and 6 extend to the reference line S4 and the reference line S5 in the direction of the stacking surface P toward the hole portion 12. That is, in the cross-section illustrated in FIG. 2, the side surfaces of the dielectric layers 4 and 6 facing the hole portion 12 extend substantially along the reference line S4 and the reference line S5 or a line connecting positions corresponding to half a thickness of the dielectric layers 4 and 6 in the side surfaces extends substantially along the reference line S4 and the reference line S5. Paying attention to the hole portion 13, the dielectric layer 2, the dielectric layer 4, and the dielectric layer 6 extend to the reference line S1 in the direction of the stacking surface P toward the hole portion 13. That is, in the cross-section illustrated in FIG. 2, the side surfaces of the dielectric layers 2, 4, and 6 facing the hole portion 13 extend substantially along the reference line S1 or a line connecting positions corresponding to half a thickness of the dielectric layers 2, 4, and 6 in the side surfaces extends substantially along the reference line S1. Paying attention to the hole portion 14, the dielectric layer 2, the dielectric layer 4, and the dielectric layer 6 extend to the reference line S6 in the direction of the stacking surface P toward the hole portion 14. That is, in the cross-section illustrated in FIG. 2, the side surfaces of the dielectric layers 2, 4, and 6 facing the hole portion 14 extend substantially along the reference line S6 or a line connecting positions corresponding to half a thickness of the dielectric layers 2, 4, and 6 in the side surfaces extends substantially along the reference line S6.

Paying attention to the hole portion 11, since the upper electrode layer 7 extends to short of the reference line S2 and the reference line S3 in the direction of the stacking surface P toward the hole portion 11, gaps G7 are formed between two side surfaces 7e on the hole portion 11 side of the upper electrode layer 7 and the reference lines S2 and S3. Paying attention to the hole portion 12, since the internal electrode layer 5 and the upper electrode layer 7 extend to short of the reference line S4 and the reference line S5 in the direction of the stacking surface P toward the hole portion 12, gaps G5 are formed between two side surfaces 5e on the hole portion 12 side of the internal electrode layer 5 and the reference lines S4 and S5, and gaps G7 are formed between two side surfaces 7e on. the hole portion 12 side of the upper electrode layer 7 and the reference lines S4 and S5.

Paying attention to the hole portion 13 and the hole portion 14, since the internal electrode layer 3, the internal electrode layer 5, and the upper electrode layer 7 extend to short of the reference line S1 and the reference line S6 in the direction of the stacking surface P toward the hole portion 13 and the hole portion 14, gaps G3 are formed between two side surfaces 3e on the hole portion 13 side and the hole portion 14 side of the internal electrode layer 3 and the reference lines S1 and S6, gaps G5 are formed between two side surfaces 5e on the hole portion 13 side and the hole portion 14 side of the internal electrode layer 5 and the reference lines S1 and S6, and gaps G7 are formed between two side surfaces 7e on the hole portion 13 side and the hole portion 14 side of the upper electrode layer 7 and the reference lines S1 and S6.

In this embodiment, in the cross-section illustrated in FIG. 2, the side surfaces 3e, 5e, and 7e of the internal electrode layer 3, the internal electrode layer 5, and the upper electrode layer 7 have a convex shape with respect to the corresponding hole portions 11, 12, 13, and 14. Maximum distances from the side surfaces 3e, 5e, and 7e to the corresponding reference lines S1, S2, S3, S4, S5, and S6 in the direction of the stacking surface P (maximum recessed quantities of the side surfaces 3e, 5e, and 7e from the reference lines S1, S2, S3, S4, S5, and S6 in the direction of the stacking surface P) are, for example, equal to or greater than 0.05 µm and equal to or less than 5 µm.

Such maximum distances may be substantially the same distances or some or all thereof may be different distances. It is preferable that the maximum recessed quantity of the side surface 7e of the upper electrode layer 7 be greater than the maximum recessed quantities of the side surfaces 5e and 3e of the internal electrode layer 5 and the internal electrode layer 3. This is because, since a current generation part which can be easily formed in a dielectric material due to electrostriction is separated from an end of the dielectric layer which is structurally vulnerable due to the recession, an effect capable of further decreasing a probability of occurrence of short-circuiting of the electrode layers can be achieved and this effect is remarkable particularly on the upper electrode layer 7 side in which concentration or an electric field can be easily caused due to a tip effect in the capacitor section 10.

Other elements of the thin-film capacitor 100 will be described below with reference to FIG. 1 again. The protective layer 21 is disposed substantially along the shape of the capacitor section 10 to cover the capacitor section 10, and includes parts covering areas of the capacitor section 10 adjacent to the side surfaces and the bottom surfaces of the hole portions 11, 12, 13, and 14, the surface 7S of the upper electrode layer 7, and the exposed surfaces of the lower electrode layer 1.

In the protective layer 21, the parts covering the areas of the capacitor section 10 adjacent to the side surfaces of the hole portions 11, 12, 13, and 14 extend along the reference lines S2, S3, S4, S5, and S6. The protective layer 21 is formed of an insulating material such as $SiO_2$, may be formed of the same material as one of the dielectric layers 2, 4, and 6, or may be formed of another material. The thickness of the protective layer 21 may be set to be, for example, equal to or greater than 0.05 µm and equal to or less than 5 µm.

The insulating layer 25 is formed to bury the capacitor section 10 and the protective layer 21. The insulating layer 25 is formed of an insulating material such as an epoxy resin, a polyimide resin, or a phenol resin. The top surface of the insulating layer 25 is substantially flat. In this embodiment, the protective layer 21 is not disposed in the gaps G3, G5, and G7.

On the insulating layer 25, the drawing electrodes 31 and 33 are disposed separated from each other in the direction of the stacking surface P. The drawing electrodes 31 and 33 are formed of a conductive material and are formed of, for example, a metal material such as Ni, Pt, Pd, Cu, Cr, Ti, W, Al, or alloy of two thereof.

The drawing electrode 31 is electrically connected to the lower electrode layer 1 and the internal electrode layer 5. Specifically, a part of the drawing electrode 31 is disposed in the hole portion 13 to extend in the stacking direction of the capacitor section 10, and the part comes in contact with the lower electrode layer 1 via a through-hole k1 disposed in the insulating layer 25 and a through-hole h1 disposed in the protective layer 21. Another part of the drawing electrode 31 is disposed in the hole portion 11 to extend in the stacking direction of the capacitor section 10, and the part comes in contact with the internal electrode layer 5 via a through-hole k5 disposed in the insulating layer 25 and a through-hole h5 disposed in the protective layer 21.

The drawing electrode 33 is electrically connected to the internal electrode layer 3 and the upper electrode layer 7. Specifically, a part of the drawing electrode 33 is disposed in the hole portion 12 to extend in the stacking direction of the capacitor section 10, and the part comes in contact with the internal electrode layer 3 via a through-hole k3 disposed in the insulating layer 25 and a through-hole h3 disposed in the protective layer 21. Another part of the drawing electrode 33 is disposed on the upper electrode layer 7 to extend in the stacking direction of the capacitor section 10, and the part comes in contact with the upper electrode layer 7 via a through-hole k7 disposed in the insulating layer 25 and a through-hole h7 disposed in the protective layer 21.

An example of a method of manufacturing the thin-film capacitor 100 according to this embodiment will be described below. In manufacturing the thin-film capacitor 100, for example, first, the dielectric layer 2, the internal electrode layer 3, the dielectric layer 4, the internal electrode layer 5, the dielectric layer 6, and a layer which will become the upper electrode layer 7 are stacked in this order on a metal foil which will become the lower electrode layer 1, for example, using a sputtering method to form a stacked body which will be the capacitor section 10 (a stacked body forming step). Instead of this step, the lower electrode layer 1, the dielectric layer 2, the internal electrode layer 3, the dielectric layer 4, the internal electrode layer 5, the dielectric layer 6, and a layer which will become the upper electrode layer 7 may be stacked in this order on a substrate, for example, using a sputtering method to form a stacked body which will be the capacitor section 10.

Then, the hole portion 11 is formed in the stacked body by covering an area other than the area of the surface of the stacked body corresponding to the hole portion 11 with a mask and then dry-etching the stacked body. Subsequently, through the same step, the hole portions 12, 13, and 14 are formed in the stacked body (a hole portion forming step). Subsequently, the protective layer 21 is formed substantially along the shape of the stacked body to cover the stacked body, for example, using a plasma CVD method (a protective layer forming step).

Then, a process of baking the stacked body (for example, at 875° C. for about one hour) is performed to crystallize the layers constituting the stacked body (a baking step). Accordingly, the capacitor section 10 is formed. At the time of sintering, the gaps G3, G5, and G7 are formed by reducing the internal electrode layer 3, the internal electrode layer 5, and the upper electrode layer 7 more than the dielectric layers 2, 4, and 6.

By appropriately selecting conditions of the sintering process (such as a sintering temperature, a temperature rising rate, and a temperature falling rate) and types of the materials constituting the layers of the capacitor section 10, the sizes of the gaps G3, G5, and G7 and the shapes of the side surfaces 3e, 5e, and 7e of the internal electrode layer 3, the internal electrode layer 5, and the upper electrode layer 7 can be controlled, In general, as the temperature rising rate in the sintering process becomes lower, the gaps G3, G5, and G7 can become larger.

After the baking process, the insulating layer 25 is formed to bury the capacitor section 10 and the protective layer 21, for example, using a spin coating method. (an insulating layer forming step). Then, the insulating layer 25 and the protective layer 21 are etched to form the through-holes k1, k3, k5, and k7, and the through-holes h1, h3, h5, and h7 (a through-hole forming step), for example, using a reactive ion etching method, the drawing electrode 31 and the drawing electrode 33 are formed, for example, using a plating method (a drawing electrode forming step), and the resultant structure is divided into individual elements by dicing if necessary, whereby the thin-film capacitor 100 is completed.

According to the thin-film capacitor 100 according to this embodiment, since the gaps G3, G5, and G7 are formed between the side surfaces 3e, 5e, and 7e on the hole portions 11, 12, 13, and 14 side of the internal electrode layer 3, the internal electrode layer 5, and the upper electrode layer 7 and the reference lines S1, S2, S3, S4, S5, and S6 (see FIG. 2), a distance of an area to be conducted when a pair of electrode layers (the lower electrode layer 1 and the internal electrode layer 3, the internal electrode layer 3 and the internal electrode layer 5, and the internal electrode layer 5 and the upper electrode layer 7) interposing the dielectric layers 2, 4, and 6 therebetween in the stacking direction short-circuit increases in comparison with a case in which such gaps are not formed. Accordingly, it is possible to prevent the pair of electrode layers from short-circuiting.

In the thin-film capacitor 100 according to this embodiment, it is preferable that the areas of the gaps G3, G5, and G7 in the cross-section illustrated in FIGS. 1 and 2 be equal to or greater than 0.0025 µm$^2$ and equal to or less than 2.5 µm$^2$. Since the areas are equal to or greater than 0.0025 µm$^2$, the distance to be conducted when the pair of electrode layers short-circuits is satisfactorily large. Accordingly, it is possible to further prevent the pair of electrode layers from short-circuiting. Since the areas are equal to or less than 2.5 µm$^2$, it is possible to prevent end portions of the dielectric layers 4 and 6 from being deformed due to insufficient support of the end portions of the dielectric layers in the gaps G3, G5, and G7.

In the thin-film capacitor 100 according to this embodiment, since the side surfaces 3e, 5e, and 7e of the internal electrode layer 3, the internal electrode layer 5, and the upper electrode layer 7 have a convex shape with respect to the corresponding hole portions 11, 12, 13, and 14 (see FIG. 2), the surface areas of the end faces of the internal electrode layer 3, the internal electrode layer 5, and the upper electrode layer 7 can be enlarged and thus it is possible to prevent concentration of an electric field on the protective layer 21 or the dielectric layers 2, 4, and 6 and to further decrease a probability of short-circuiting of the electrode layers.

The thin-film capacitor according to this embodiment further includes the protective layer 21 including parts that are disposed in the hole portions 11, 12, 13, and 14 along the reference lines S1, S2, S3, S4, S5, and S6 in the cross-section illustrated in FIGS. 1 and 2, and the protective layer 21 is not present in the gaps G3, G5, and. G7 (see FIGS. 1 and 2). Since the side surfaces of the dielectric layers 2, 4, and 6 and the electrode layers 3, 5, and 7 adjacent to the hole portions 11, 12, 13, and 14 are protected by the protective layer 21, it is possible to further prevent the pair of electrode layers from short-circuiting. Since the protective layer 21 is not present in the gaps G3, G5, and G7, a current generation part which is easily formed in the dielectric material due to electrostriction can be separated from the ends of the dielectric layers which are structurally vulnerable and thus it is possible to further decrease a probability of short-circuiting of the electrode layers.

Second Embodiment

Figure 3:
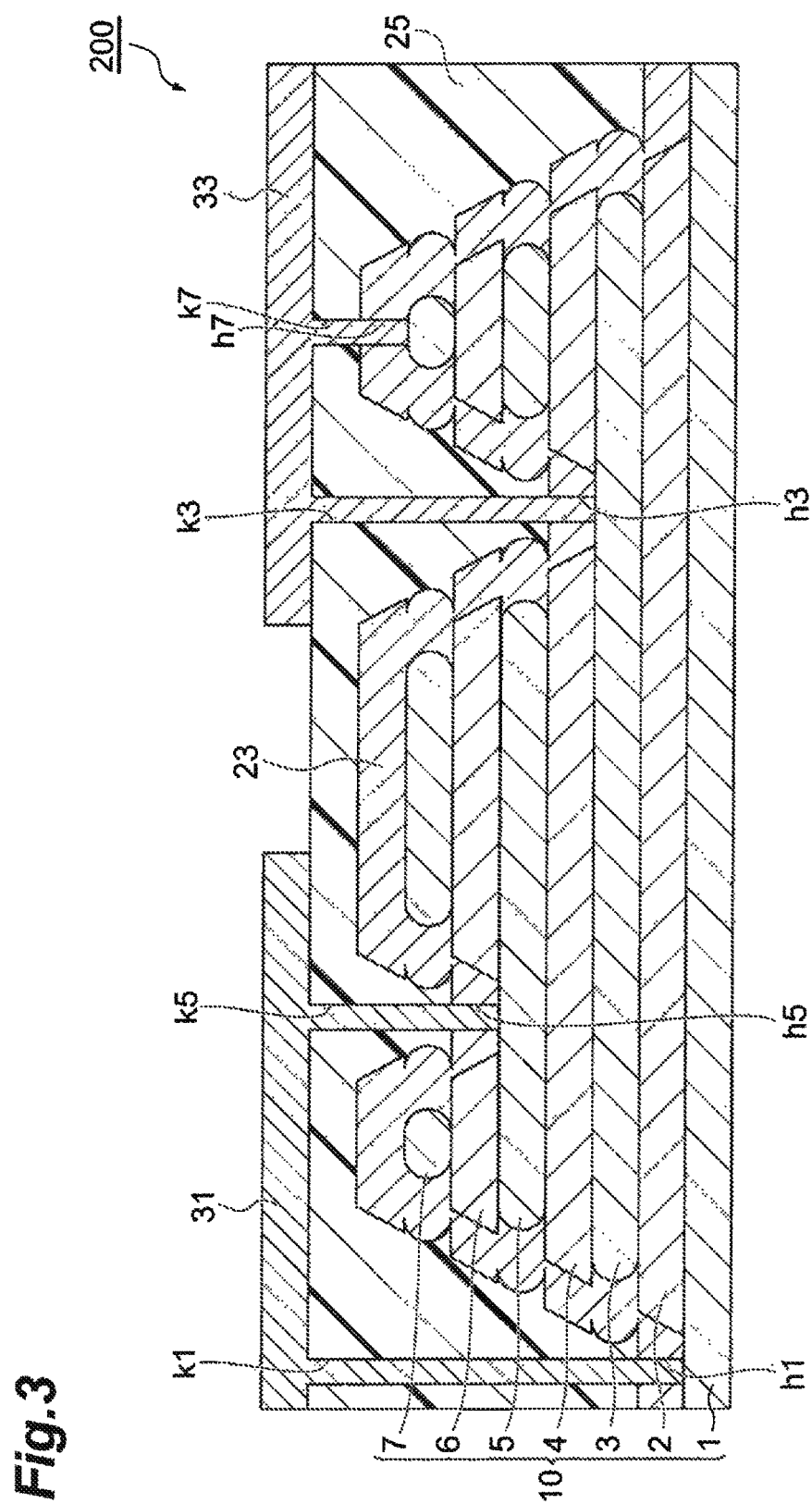
FIG. 3 is a cross-sectional view of a thin-film capacitor according to a second embodiment.

A thin-film capacitor according to a second embodiment of the invention will be described below. FIG. 3 is a cross-sectional view of a thin-film capacitor according to the second embodiment and corresponds to the cross-sectional view of the thin-film capacitor 100 according to the first embodiment illustrated in FIG. 1.

A thin-film capacitor 200 according to this embodiment illustrated in FIG. 3 is different from the thin-film capacitor 100 according to the first embodiment in the configuration of a protective layer disposed to cover the capacitor section 10. That is, the protective layer 23 according to this embodiment is also disposed in the gaps G3, G5, and G7. Specifically, parts of the protective layer 23 covering the side surfaces of the hole portions 11, 12, 13, and 14 extend along the reference lines S2, S3, S4, S5, and S6 and are disposed in the gaps G3, G5, and G7. The surface of the protective layer 23 has an uneven shape corresponding to the shapes of the gaps G3, G5, and G7.

A method of manufacturing the thin-film capacitor 200 according to this embodiment is the same as the method of manufacturing the thin-film capacitor 100 according to the first embodiment, except that the protective layer forming step and the baking step are reversed in order. That is, the thin-film capacitor 200 according to this embodiment can be manufactured by performing the steps of the method of manufacturing the thin-film capacitor 100 according to the first embodiments in the order of the stacked body forming step, the hole portion forming step, the baking step, the protective layer forming step, the insulating layer forming step, and the drawing electrode forming step.

According to the thin-film capacitor 200 according to this embodiment, it is possible to prevent a pair of electrode layers interposing the dielectric layer therebetween in the stacking direction from short-circuiting for the same reason as in the thin-film capacitor 100 according to the first embodiment.

According to the thin-film capacitor 200 according to this embodiment, since the side surfaces of the dielectric layers 2, 4, and 6, the lower electrode layer 1, the internal electrode layers 3 and 5, and the upper electrode layer 7 adjacent to the hole portions 11, 12, 13, and 14 are protected by the protective layer 23, it is possible to further prevent a pair of electrode layers interposing the dielectric layer therebetween in the stacking direction from short-circuiting. Since the protective layer 23 is present in the gaps G3, G5, and G7, it is possible to prevent the end portions of the internal electrode layer 3, the internal electrode layer 5, and the upper electrode layer 7 from being deformed due to insufficient support of the end portions in the gaps G3, G5, and G7.

The invention is not limited to the above-mentioned embodiments, and can be modified in various forms.

For example, in the thin-film capacitor 100 according to the first embodiment and the thin-film capacitor 200 according to the second embodiment, the side surfaces 3e, 5e, and 7e of the internal electrode layer 3, the internal electrode layer 5, and the upper electrode layer 7 have a convex shape with respect to the corresponding hole portions 11, 12, 13, and 14 (see FIGS. 1 to 3), but the shape of the side surfaces 3e, 5e, and 7e is not limited to such a shape.

Figure 4A:
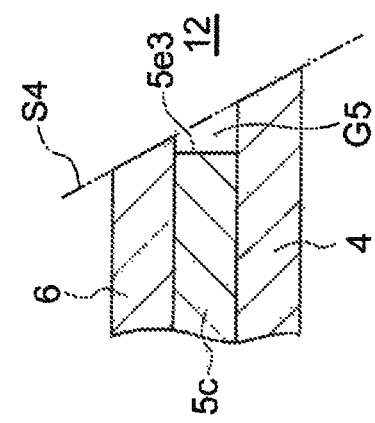
FIGS. 4A to 4C are cross-sectional views illustrating an example of another aspect of a side surface of an internal electrode layer.
Figure 4B:
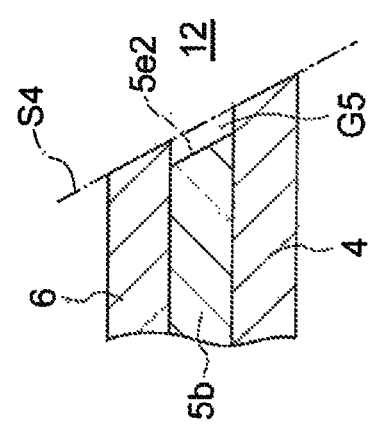
Figure 4C:
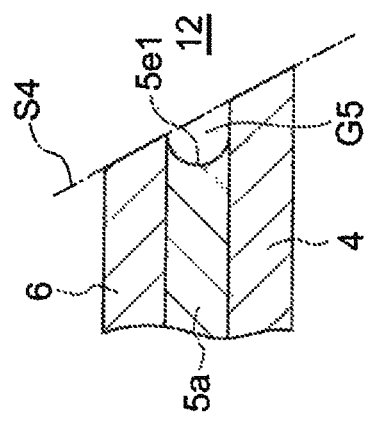

FIGS. 4A to 4C are cross-sectional views illustrating other examples of the side surface of the internal electrode layer and correspond to the cross-sectional views illustrated in FIGS. 1 to 3. In the example illustrated in FIG. 4A, the side surface 5e1 of the internal electrode layer 5a interposed between the dielectric layer 4 and the dielectric layer 6 has a concave shape with respect to the corresponding hole portion 12. In the example illustrated in FIG. 4B, the side surface 5e2 of the internal electrode layer 5b interposed between the dielectric layer 4 and the dielectric layer 6 has a straight line shape extending in a direction forming an acute angle with respect to the stacking direction of the capacitor section 10. In the example illustrated in FIG. 4C, the side surface 5e3 of the internal electrode layer 5c interposed between the dielectric layer 4 and the dielectric layer 6 has a straight line shape extending in a direction substantially parallel to the stacking direction of the capacitor section 10.

The side surface 3e of the internal electrode layer 3 and the side surface 7e of the upper electrode layer 7 may similarly have various shapes as illustrated in FIGS. 4A to 4C. The side surface 3e of the internal electrode layer 3, the side surface 5e of the internal electrode layer 5, and the side surface 7e of the upper electrode layer 7 may have substantially the same shape or may have different shapes in the above-mentioned cross-section.

In the thin-film capacitor 100 according to the first embodiment and the thin-film capacitor 200 according to the second embodiment, the gaps G3, G5, and G7 are formed in the cross-section satisfying the conditions that the cross-section is perpendicular to the stacking surface of the capacitor section 10 and passes through the hole portions 11, 12, 13, and 14 (see FIG. 2). However, in some cross-sections of a plurality of cross-sections satisfying conditions that the cross-section is perpendicular to the stacking surface of the capacitor section 10 and passes through at least one of the hole portions 11, 12, 13, and 14, at least one of the gaps G3, G5, and G7 has only to be formed in the capacitor section 10.

In the thin-film capacitor 100 according to the first embodiment and the thin-film capacitor 200 according to the second embodiment may not include the protective layer 21 arid the protective layer 23. In this case, the areas in which the protective layer 21 and the protective layer 23 are formed may be occupied by the insulating layer 25.

The protective layer 23 of the thin-film capacitor 200 according to the second embodiment is disposed in the gaps to occupy all the gaps G3, G5, and G7 (see FIG. 3), but may be disposed in the gaps to occupy only a part of the gaps G3, G5, and G7.

What is claimed is:

1. A thin-film capacitor comprising:
a capacitor section in which electrode layers and dielectric layers are alternately stacked such that at least one dielectric layer is interposed in a stacking direction between a pair of electrode layers, the capacitor section including a hole portion that extends from an uppermost surface of the capacitor section to a lower electrode layer in the stacking direction of the pair of electrode layers; and
a drawing electrode,
wherein,
in a cross-section which is perpendicular to a stacking surface of the capacitor section and which passes through the hole portion, a side surface of the hole portion extends along a reference line extending in a direction intersecting the stacking surface, the at least one dielectric layer extends up to the reference line toward the hole portion, and a gap is formed between the side surface on the hole portion side of at least one of the pair of electrode layers and the reference line,
a bottom surface of the hole portion is defined by the lower electrode layer in the stacking direction of the pair of electrode layers,
at least a part of the drawing electrode extends in the hole portion to the bottom surface of the hole portion so as not to contact with the side surfaces on the hole portion side of the pair of electrode layers, the drawing electrode contacting with the lower electrode layer at the bottom surface of the hole portion, and
an entirety of the side surface on the hole portion side of the at least one of the pair of electrode layers is separated from the reference line by the gap.

2. The thin-film capacitor according to claim 1, wherein an area of the gap in the cross-section is 0.0025 $\mu m^2$ to 2.5 $\mu m^2$.

3. A thin-film capacitor comprising:
a capacitor section in which electrode layers and dielectric layers are alternately stacked such that at least one dielectric layer is interposed in a stacking direction between a pair of electrode layers, the capacitor section including a hole portion that extends from an uppermost surface of the capacitor section to a lower electrode layer in the stacking direction of the pair of electrode layers,
wherein,
in a cross-section which is perpendicular to a stacking surface of the capacitor section and which passes through the hole portion, a side surface of the hole portion extends along a reference line extending in a direction intersecting the stacking surface, the at least one dielectric layer extends up to the reference line toward the hole portion, and a gap is formed between the side surface on the hole portion side of at least one of the pair of electrode layers and the reference line, a bottom surface of the hole portion is defined by the lower electrode layer in the stacking direction of the pair of electrode layers, an entirety of the side surface on the hole portion side of the at least one of the pair of electrode layers is separated from the reference line by the gap, and the side surface on the hole portion side of the least one of the pair of electrode layers has a convex shape or a concave shape with respect to the gap.

4. A thin-film capacitor comprising:

a capacitor section in which electrode layers and dielectric layers are alternately stacked such that at least one dielectric layer is interposed in a stacking direction between a pair of electrode layers, the capacitor section including a hole portion that extends from an uppermost surface of the capacitor section to a lower electrode layer in the stacking direction of the pair of electrode layers, wherein, in a cross-section which is perpendicular to a stacking surface of the capacitor section and which passes through the hole portion, a side surface of the hole portion extends along a reference line extending in a direction intersecting the stacking surface, the at least one dielectric layer extends up to the reference line toward the hole portion, and a gap is formed between the side surface on the hole portion side of at least one of the pair of electrode layers and the reference line, a bottom surface of the hole portion is defined by the lower electrode layer in the stacking direction of the pair of electrode layers, and an entirety of the side surface on the hole portion side of the at least one of the pair of electrode layers is separated from the reference line by the gap, and further comprising a protective layer that is formed of an insulating material and that is disposed in the hole portion along the reference line in the cross-section, wherein the protective layer is not present in the gap.

5. A thin-film capacitor comprising:

a capacitor section in which electrode layers and dielectric layers are alternately stacked such that at least one dielectric layer is interposed in a stacking direction between a pair of electrode layers, the capacitor section including a hole portion that extends from an uppermost surface of the capacitor section to a lower electrode layer in the stacking direction of the pair of electrode layers, wherein, in a cross-section which is perpendicular to a stacking surface of the capacitor section and which passes through the hole portion, a side surface of the hole portion extends along a reference line extending in a direction intersecting the stacking surface, the at least one dielectric layer extends up to the reference line toward the hole portion, and a gap is formed between the side surface on the hole portion side of at least one of the pair of electrode layers and the reference line, a bottom surface of the hole portion is defined by the lower electrode layer in the stacking direction of the pair of electrode layers, and an entirety of the side surface on the hole portion side of the at least one of the pair of electrode layers is separated from the reference line by the gap, and further comprising a protective layer that is formed of an insulating material and that is disposed in the hole portion along the reference line in the cross-section, wherein the protective layer is present also in the gap.

* * * * *